United States Patent
Koutsogeorgis et al.

(10) Patent No.: US 10,317,580 B2
(45) Date of Patent: Jun. 11, 2019

(54) SURFACE PLASMON RESONANCE IN THIN FILMS

(75) Inventors: Demosthenes Koutsogeorgis, Nottinghamshire (GB); Panos Patsalas, Salonika (GR); Elefterios Lidorikis, Ioannina (GR); Wayne Cranton, Sheffield (GB)

(73) Assignee: Nottingham Trent University, Nottinghamshire (GB)

( * ) Notice: Subject to any disclaimer, the term of this patent is extended or adjusted under 35 U.S.C. 154(b) by 0 days.

(21) Appl. No.: 14/237,484

(22) PCT Filed: Aug. 8, 2012

(86) PCT No.: PCT/GB2012/051918
§ 371 (c)(1),
(2), (4) Date: Jun. 17, 2014

(87) PCT Pub. No.: WO2013/021197
PCT Pub. Date: Feb. 14, 2013

(65) Prior Publication Data
US 2014/0300978 A1 Oct. 9, 2014

(30) Foreign Application Priority Data

Aug. 8, 2011 (GB) .................................. 1113643.9

(51) Int. Cl.
*G02B 5/00* (2006.01)
*C23C 14/06* (2006.01)
(Continued)

(52) U.S. Cl.
CPC .......... *G02B 5/008* (2013.01); *C23C 14/0641* (2013.01); *C23C 14/14* (2013.01); *C23C 14/28* (2013.01); *C23C 14/34* (2013.01)

(58) Field of Classification Search
CPC ..... G02B 6/29361; G02B 6/132; G02B 5/285
(Continued)

(56) References Cited

U.S. PATENT DOCUMENTS 5,401,569 A * 3/1995 Kineri .................. G02F 1/3551
359/329
6,618,204 B2 * 9/2003 Takatori ........................ 359/640
(Continued)

FOREIGN PATENT DOCUMENTS

EP 2317372 5/2011
JP WO 2011024336 A1 * 3/2011 ............. B82Y 20/00
(Continued)

OTHER PUBLICATIONS

"Laser Ablation and Thin Film Deposition", Christof W. Schneider and Thomas Lippert, Springer Series in Materials Science vol. 139, 2010, pp. 89-112, Jun. 19, 2010, Attached location: Chapter 5, Section 5.2, paragraph 3.*
(Continued)

*Primary Examiner* — Stephone B Allen
*Assistant Examiner* — Travis S Fissel
(74) *Attorney, Agent, or Firm* — Dewitt LLP; Thomas J. Nikolai

(57) ABSTRACT

A thin film comprising a layer of dielectric material having electrically conductive inclusions, wherein the thin film has a first reflectivity due to surface plasmon resonance, and wherein the thin film is configured to provide one or more selected regions having a second reflectivity due to surface plasmon resonance.

8 Claims, 3 Drawing Sheets

(51) Int. Cl.
*C23C 14/14* (2006.01)
*C23C 14/28* (2006.01)
*C23C 14/34* (2006.01)

(58) Field of Classification Search
USPC ........ 359/231, 360, 839, 350, 832; 977/777, 977/778, 779, 784, 786, 832, 834
See application file for complete search history.

(56) References Cited

U.S. PATENT DOCUMENTS

| | | | | |
|---|---|---|---|---|
| 6,798,521 | B2* | 9/2004 | Elkind et al. | 356/445 |
| 7,247,354 | B2* | 7/2007 | Blanchet-Fincher | 427/596 |
| 7,405,134 | B2* | 7/2008 | Yudasaka | H01L 21/02532 438/149 |
| 7,648,834 | B2* | 1/2010 | Moore | 435/287.1 |
| 7,901,776 | B2* | 3/2011 | Paolucci | B01D 67/0058 423/447.1 |
| 8,038,494 | B2* | 10/2011 | Choi | H01L 51/5012 313/504 |
| 8,164,092 | B2* | 4/2012 | Tiwari | H01L 21/02381 257/53 |
| 2004/0180379 | A1* | 9/2004 | Van Duyne | B82Y 15/00 435/7.1 |
| 2004/0232438 | A1* | 11/2004 | Ogawa | H01L 33/30 257/103 |
| 2006/0275541 | A1* | 12/2006 | Weimer | G01N 21/658 427/96.1 |
| 2010/0126567 | A1* | 5/2010 | Kaufman | G02B 5/008 136/252 |
| 2010/0149530 | A1* | 6/2010 | Tomaru | G01N 21/658 356/301 |
| 2011/0013192 | A1* | 1/2011 | Yang | G01N 21/554 356/445 |
| 2011/0114855 | A1* | 5/2011 | Kawakami | B23K 26/0613 250/492.2 |
| 2012/0140305 | A1 | 6/2012 | Yashiro et al. | |

FOREIGN PATENT DOCUMENTS

| | | |
|---|---|---|
| WO | WO 2005/017570 | 2/2005 |
| WO | WO 2011/024336 | 3/2011 |

OTHER PUBLICATIONS

Pradhan et al., "Surface plasmon resonance in CdSe semiconductor coated with gold nanoparticles," Opt. Express 16, 6202-6208 (2008).*
Stepanov, Modification of Implanted Metal Nanoparticles in The Dielectrics by High-Power Laser Pulses, Rev.Adv.Mater.Sci. 4 (2003) 123-138.*
Torrell et al., "Functional and optical properties of Au:TiO2 nanocomposite films: The influence of thermal annealing", Applied Surface Science, 2010, 256, 6536-6542.

* cited by examiner

5nm

5nm

SURFACE PLASMON RESONANCE IN THIN FILMS

CROSS-REFERENCE TO RELATED APPLICATIONS

This application is the National Stage of International Patent Application No. PCT/GB2012/051918, filed Aug. 8, 2012, which claims the benefit of Great Britain Patent Application No. 1113643.9, filed Aug. 8, 2011, the disclosures of which are incorporated herein by reference in their entireties.

TECHNICAL FIELD

This invention relates to a material having regions which display modified optical characteristics due to surface plasmon resonance and a method of creating a material having regions which display modified optical characteristics

BACKGROUND TO THE INVENTION

Dielectric thin films are widely used for many applications and may be fabricated using a variety of techniques, which involve depositing a layer of the dielectric material onto a substrate. Often, characteristics of the dielectric can be altered by the addition of a conductive material. One such characteristic is surface plasmon resonance (SPR).

Surface plasmon resonance is often perceived as enhanced reflectivity of the dielectric material, and is exploited in many fields of technology. Resonance of surface plasmons are often achieved by thermally processing a thin film, such that the resulting thin film displays a moderate increase in reflectivity. Thermal processing is not viable for thin films deposited on plastic or cellophane substrates and only a complete thin film sample can be annealed using thermal processing. Consequently, the use of thermal processing to provide surface plasmon resonance limits the application of the phenomenon of surface plasmon resonance.

It is an object of the present invention to eliminate or at least mitigate some of the restrictions in the exploitation of the phenomenon exhibited by existing techniques.

SUMMARY OF THE INVENTION

Accordingly, a first aspect of the invention provides a thin film according to claim 1.

According to a second aspect of the invention, there is provided a method for creating a thin film according to claim 11.

Preferable features of the invention are defined by the dependent claims and are set out in the following description.

BRIEF DESCRIPTION OF THE DRAWINGS

Embodiments of the invention will be described by way of example only, with reference to the following drawings in which.

DETAILED DESCRIPTION

Figure 1:
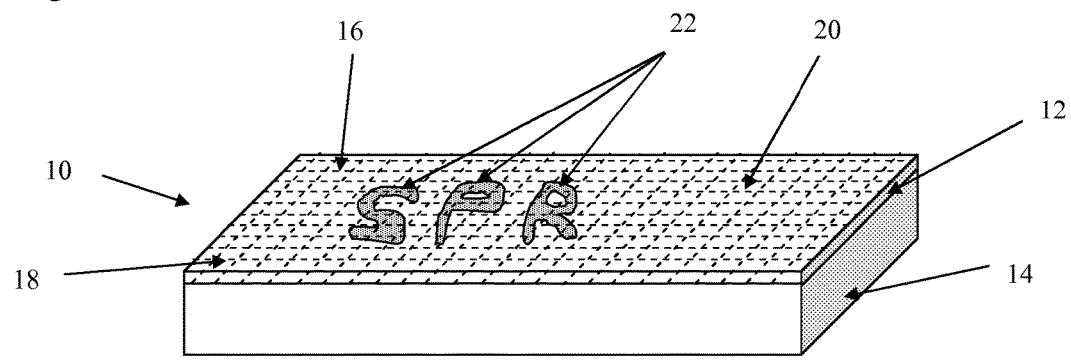
FIG. 1 is a schematic perspective view of a thin film (deposited on a substrate) in accordance with a preferred embodiment of the invention.

FIG. 1 shows a sample of a thin film 10. The thin film 10 comprises a layer of deposited material 12 on a substrate 14. The layer of material 12 comprises an insulating material 16. The insulating material 16 is preferably a dielectric material and is more preferably Aluminium Nitride (AlN). The layer of material 12 further comprises electrically conductive inclusions 18. The electrically conductive inclusions 18 are intended to refer to a distribution of electrically conductive inclusions throughout the layer of dielectric material achieved by the deposition of the layer of material 12 onto the substrate 14, as will be apparent to a person skilled in the art. Preferably, the electrically conductive inclusions are a metal which exhibits poor wetting behaviour against the dielectric. More preferably, the metal is a noble metal such as Silver (Ag). The substrate 14 is an insulating material, and is preferably a dielectric material and may be a flexible plastic or cellophane. In some embodiments, however, the substrate may be conductive or semiconductive (such as Silicon).

The thin film 10 has enhanced or reduced reflectivity, transmission or absorption due to surface plasmon resonance when illuminated by radiation having a wavelength within a specific range. The thin film 10 comprises a region 20 which has a first reflectivity due to surface plasmon resonance and one or more discrete regions 22, here the letters 'SPR', which have a second reflectivity due to surface plasmon resonance. Whilst three discrete regions 22 are depicted in FIG. 1, it will be appreciated that one or more discrete regions can be created. In a preferred embodiment of the invention, the regions 22 have a second reflectivity which is modified compared to the first reflectivity of region 20. This modification in reflectivity is evident in a shift in the wavelength of incident radiation and/or as an increase (or decrease) in the intensity of the reflected radiation. The regions 22 are created by illuminating regions 22 with radiation having specific characteristics, as will be described in detail below.

A thin film sample may be prepared by pulsed laser deposition of Ag and AlN onto a substrate 14 to result in a layer 12 of AlN having Ag inclusions on the substrate 14. Using this technique, the resulting, un-processed thin film exhibits a moderate level of SPR, indicated by a first reflectivity. A thin film sample may also be prepared by sputtering AlN and Ag onto the substrate 14 such that layer 12 comprises layers of AlN and Ag on the substrate 14. The depth of each AlN layer is approximately 20 nm and the depth of each Ag layer is approximately 3 nm, and there are between 10 and 20 layers of both the AlN and Ag. When prepared by sputtering, region 20 of the thin film exhibits little or no SPR. It will be appreciated by those skilled in the art that any thin film fabrication process or technique may be adopted to prepare the thin film.

Figure 2:
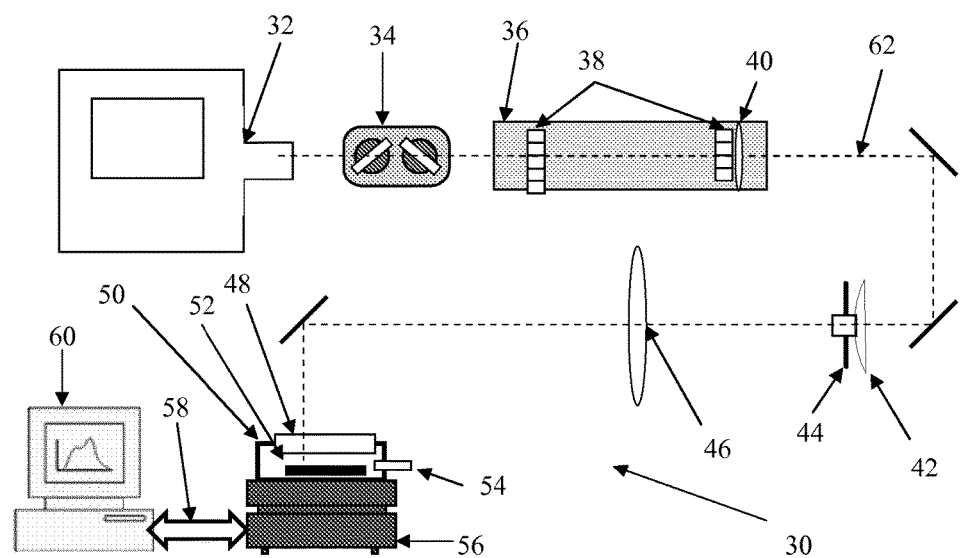
FIG. 2 is a diagram of apparatus used to create the thin film of FIG. 1 in accordance with a preferred embodiment of the invention.

The thin film 10 is created by illuminating selected regions 22 with radiation. An exemplary apparatus configuration 30 for creating the thin film 10 by laser processing will be described with reference to FIG. 2, and comprises light source 32, variable attenuator 34, beam homogeniser 36, lens arrays 38, condenser lens 40, field lens 42, mask stage 44, projection lens 46, UV window 48, pressure cell 50, thin film sample 52, gas inlet 54, translation stage 56, interface 58 and controller 60.

Light source 32 emits a signal 62 of radiation. Signal 62 passes through a variable attenuator 34 which attenuates the signal 62. The signal 62 then passes through a beam homogeniser 36 containing lens arrays 38 and condenser lens 40 to create a uniform beam of radiation from signal 62. A field lens 42 adjusts the cross sectional area of the signal 62 which then passes through mask stage 44 and through projection lens 46. A thin film sample 52 is housed in a pressure cell 50 which is located on a translation stage 56. The pressure cell 50 is configured to pressurise the sample 52 to any desired pressure using the gas inlet 54. A UV window allows any UV radiation in the signal 62 to pass through it before the signal impacts sample 52. As shown schematically in FIG. 2, components of the apparatus 30 are in communication with a controller 60 via interface 58. The controller 60 comprises any suitable equipment through which data and instructions may be input to control operation of the components of the apparatus 30. The interface 58 may be any suitable interface and is preferably an RS 232 interface.

The sample of thin film may be at any temperature prior to processing and in any environment such as within a chamber of an inert or active gas. The laser processing comprises irradiation of the sample which may include annealing of the sample. The laser is preferably a Carbon dioxide, Excimer or Nd:YAG laser which is arranged to emit radiation having a wavelength between 157 nm to 10.4 µm. Furthermore, the laser may emit radiation having any fluence. The radiation may be emitted in the form of a beam having a substantially circular cross section, the area of which may be varied, but typically has a diameter between 100 µm and 7 mm, but is preferably between 3 mm and 7 mm. In addition, the radiation emitted may be circularly or linearly polarised, and is emitted in pulses, each of which may have differing durations. It will be appreciated that other configurations and values of parameters are compatible with embodiments of the present invention. For example, a raster scan technique may be adopted for laser processing of large areas of a sample 52. Alternatively, the laser is arranged to emit a long, thin beam of radiation, having a rectangular cross section of approximately 300 µm by 15 cm. In this configuration, pulses are emitted and the sample is moved at high speed across the width of the beam according to a desired exposure.

In a preferred embodiment, unpolarised radiation is emitted in a continuous pulse, the duration of which is in the order of 25 ns. The wavelength of the radiation is 193 nm and has a fluence of 400 mJ/cm$^2$ to a thin film sample which is (initially) at room temperature and in open air.

Figure 3:
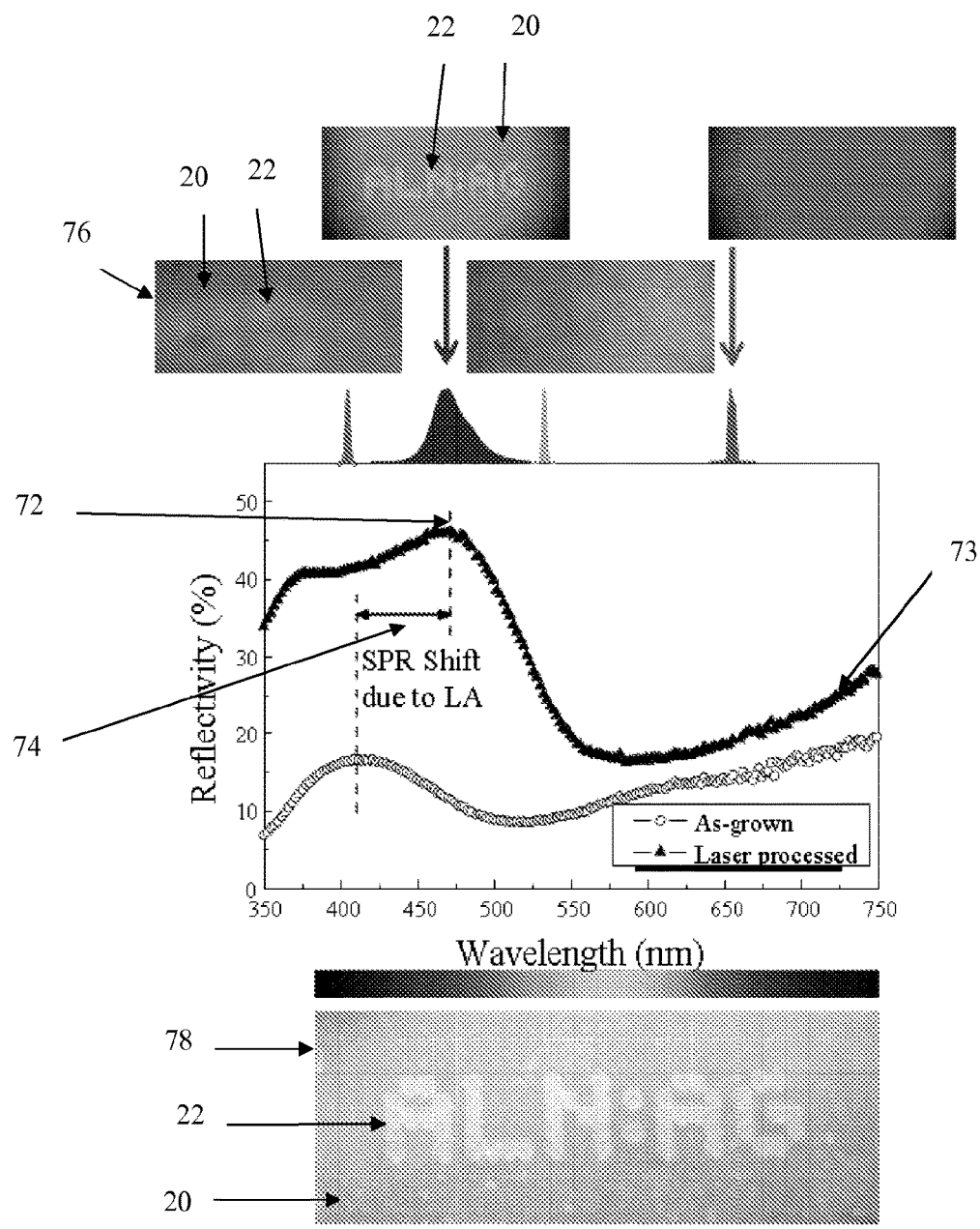
FIG. 3 is a diagram illustrating the change in reflectivity of regions of the thin film of FIG. 1 according to wavelength of incident light in accordance with preferred embodiments of the present invention.

The effect of laser processing of selected areas 22 of the thin film 10 will be described with reference to FIG. 3, which shows an example of the enhances reflectivity of the regions 22 compared to region 20 when the sample is illuminated by light having a wavelength within a predetermined range. The lower curved series of circles depict the change in reflectivity of the area 20 (i.e. the unprocessed thin film, after preparation of the sample by sputtering or pulsed laser deposition (as grown)) with wavelength of incident light used on the thin film. It can be seem that there is a moderate increase in reflectivity when the thin film is illuminated by light having a wavelength in the lower range, i.e. violet and blue. This is shown by the photograph 76 of the sample, where selected regions (defined as letters ALN: AG) (not shown) are illuminated by radiation having a wavelength of approximately 420 nm.

The upper curved series of triangles 73 depict the enhanced reflectivity of the laser-processed regions 22. It can be seen that there is a significant increase in reflectivity compared to the non-processed region 20 when the wavelength of incident light is around 470 nm (shown on FIG. 3 as peak 72). The shift of the wavelength of the peak in reflectivity between region 20 and regions 22 is shown by the horizontal arrow 74, wherein the peak reflectivity for non-processed region 20 is about 410 nm and the peak for the processed region 22 is about 470 nm. The increase in peak reflectivity can be seen to be from about 16% to about 46%, representing about three times the reflectivity for the processed region 22 compared to non-processed region 20. The lower photograph 78 shows the enhanced reflectivity of areas 22 compared with region 20 when the thin film 10 is illuminated by white light.

Figure 4:
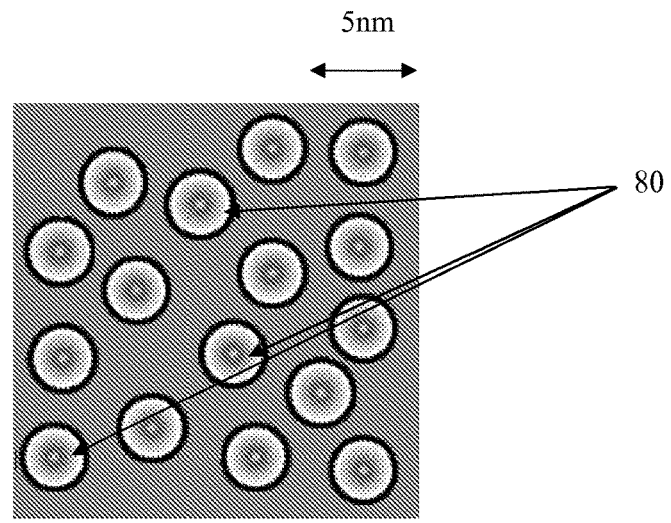
FIG. 4 is a schematic representation of the interior of a thin film prior to laser processing.
Figure 5:
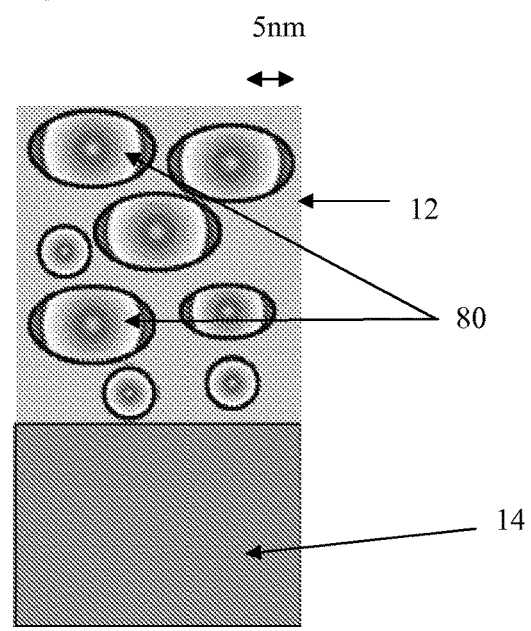
FIG. 5 is a schematic representation of the interior of the thin film after laser processing according to a preferred embodiment of the present invention.

The structural change within the thin film created by the laser processing will be described with reference to FIGS. 4 and 5. FIGS. 4 and 5 are schematic representations of the interior of a thin film before laser processing and after laser processing respectively. With reference to FIG. 4, clusters of Ag inclusions 80 are seen as hatched ovals. It will be appreciated by those skilled in the art that AlN is a lattice, crystalline structure. It can be seen from FIG. 5 that the shape, size and distribution of the inclusions 80 varies throughout the layer 12.

It is believed that localised heating of the thin film during laser processing raises its temperature to around 2000K, such that processing of both the AlN and Ag occurs. Following optimised laser processing at 193 nm (i.e. according to values of the parameters described above) the clusters of Ag inclusions 80 are enlarged.

The present invention provides a flexible material which exhibits spectrally selective enhanced reflectivity due to surface plasmon resonance. It will be appreciated that such a material has a wide variety of uses in many technological areas, facilitating the exploitation of SPR in areas which were not previously possible due to the limitations (and only moderate level of SPR) presented by other processing techniques. Whilst the present invention has many uses, it is foreseen that a particularly relevant field for its exploitation is in the field of security tagging, brand protection, document security and product authentication. The method of creating a thin film having the characteristics described further provides for a platform technology.

The invention claimed is:

1. A method of creating a thin film of dielectric material having electrically conductive inclusions, the thin film having one or more selected regions of enhanced reflectivity compared to the reflectivity of the non-selected regions of the thin film, due to local surface plasmon resonance, the method comprising the steps of:
   creating a thin film of dielectric material having clusters of electrically conductive inclusions contained within the thin film, and
   then creating in the thin film selected regions of enhanced reflectivity due to local surface plasmon resonance within the thin film, the selected regions also comprising the clusters of electrically conductive inclusions, wherein the clusters of electrically conductive inclusions are larger in the one or more selected regions than in the non-selected regions, wherein the step of creating selected regions comprises illuminating one or more selected regions of the thin film with radiation of a predetermined wavelength by laser annealing the selected one or more regions of the thin film to thereby enlarge the clusters of inclusions in the one or more selected regions.

2. The method of claim 1, wherein the predetermined wavelength of the radiation is within the range of 157 nm to 10.4 µm.

3. The method of claim 1, wherein the predetermined wavelength of the radiation is within the range of 193 nm to 248 nm.

4. The method of claim 1, wherein a duration of the illumination by the radiation is between 20 ns-30 ns.

5. The method of claim 3, wherein the radiation has a radiation of fluence of 400 mj/cm$^2$.

6. The method of claim 1 wherein the radiation is unpolarised.

7. The method of claim 1, wherein the step of creating a thin film of dielectric material with clusters of electrically conductive clusters comprises depositing Aluminium Nitride and Silver onto a dielectric substrate by pulsed laser deposition.

8. The method of claim 1, wherein the step of creating the thin film of dielectric material with clusters of electrically conductive clusters comprises sputtering of alternate layers of Aluminium Nitride and Silver.

* * * * *